June 6, 1967 P. J. W. JOCHEMS ETAL 3,323,955

METHOD OF MANUFACTURING SEMI-CONDUCTOR DEVICES

Filed Feb. 20, 1964 2 Sheets-Sheet 1

INVENTORS
Pieter J.W. Jochems.
Reinier de Werdt.
Dirk de Nobel
BY
Frank R. Jufani
AGENT

METHOD OF MANUFACTURING SEMI-CONDUCTOR DEVICES

Filed Feb. 20, 1964 2 Sheets-Sheet 2

INVENTORS
Pieter J.W. Jochems.
Reinier de Werdt.
BY Dirk de Nobel
Frank R. Jifani
AGENT United States Patent Office 3,323,955

Patented June 6, 1967

3,323,955

METHOD OF MANUFACTURING SEMICONDUCTOR DEVICES

Pieter Johannes Wilhelmus Jochems, Reinier de Werdt, and Dirk de Nobel, all of Emmasingel, Eindhoven, Netherlands, assignors to North American Philips Company, Inc., New York, N.Y., a corporation of Delaware Filed Feb. 20, 1964, Ser. No. 346,162
Claims priority, application Netherlands, Mar. 29, 1963, 290,930; Sept. 25, 1963, 298,354
8 Claims. (Cl. 148—177)

This invention relates to methods of manufacturing semiconductor devices comprising a semiconductor body covered with at least one highly conductive layer recrystallised from an electrode material alloyed with the body, which layer is provided with a first supply electrode and lies, at least at the surface of the body, in the vicinity of a second highly conductive surface layer in the body which is highly conductive due to incorporation of active impurities and which is electrically connected to a second supply electrode at some distance from the recrystallised layer. The invention also relates to semiconductor devices and special embodiments thereof as manufactured by the use of a method according to the invention.

The described structure of a semiconductor body is frequently used, for example, in so-called diffusion transistors in which the alloy electrode and the associated recrystallization layer have a conductivity type opposite to that of the surface layer, the latter being provided in the body by diffusion.

Thus, for example, p-n-p type germanium diffusion transistors are known in which an n-type conductive diffusion layer constitutes the base zone of the transistor and is obtained by diffusion of a donor such as, for example, arsenic into a p-type conductive initial body. An alloy electrode, which is intended as an emitter, is locally provided on the said n-type conductive diffusion layer by alloying on it contact material containing an acceptor. A p-type conductive recrystallized zone is formed under the alloy electrode upon cooling after alloying and penetrates the n-type conductive layer only to a portion of the depth of penetration thereof, the said zone thus lying, inter alia at the surface, in the vicinity of the n-type conductive diffusion layer which is provided, at some distance from the emitter, with the base contact of the transistor.

Also n-p-n-type silicon transistors are already known which are manufactured by providing successively or simultaneously a p-type conductive diffusion layer and, in the surface portion of the latter, an n-type conductive diffusion layer in an n-type conductive initial body. A base electrode with the p-type conductive layer located at a greater depth, which is intended as a base zone, is obtained by alloying an acceptor-containing material, for example in the form of a ring, for a short time at a low temperature on the n-type conductive layer which is intended, at least in part, as an emitter zone. The p-type conductive recrystallized layer under the annular base penetrates through the n-type conductive layer into the p-type conductive base zone, thus surrounding a portion of the n-type conductive diffusion layer enclosed by the ring and which is active as the emitter zone on which an emitter contact is provided as a supply conductor.

The alloy electrode material often used in such cases is aluminum which ensures, because of its good solubility, a high conductivity in the recrystallized emitter zone and hence a high emitter efficiency in a pnp-type transistor and a low resistance of the base contact in an npn-type transistor. The diffusion of the donor and the alloying of the acceptor are carried out in this sequence one after the other as separate treatments since a much higher temperature and a longer duration are required for diffusion than for alloying. The duration of the alloying process is as short as possible and the temperature is so low that substantially no diffusion can occur.

It is also known for the manufacture of a pnp-type germanium transistor to carry out the diffusion of the base zone simultaneously with the alloying of the acceptor. In this case an alloy of lead or bismuth and not more than a few percent of gallinum or aluminum is used as the acceptor-containing material. During alloying, a donor diffuses, for example from the ambience or from the alloy applied, through the melt into the underlying germanium and into the germanium surface located next to the melt, thus constituting the n-type conductive base zone on which a p-type conductive emitter zone with the associated emitter recrystallizes upon cooling due to the segregation of the acceptor. A base contact, which is active as a supply conductor, is applied to the n-type conductive surface layer at the same time or afterwards at some distance from the said emitter. The portion of the base zone located in the vicinity of the alloy emitter is obtained from the electrode melt by diffusion of the active donor impurities.

The known manufacturing methods above described suffer from several disadvantages and limitations. In fact, to obtain electrical properties of the pn-junction which are still suitable in practice, more particularly a reasonably high value for the breakdown voltage between the p-type and n-type conductive layers adjacent to each other, and to avoid interfering "tunnel effects" and short-circuit, in known methods the concentration of donors or acceptors in one of the two layers, more particularly at the surface of the body, is chosen to be less than $10^{18}$ cc. for germanium and $10^{19}$ cc. for silicon. Since the recrystallization layer usually has a high conductivity due to a high concentration of at least about $10^{18}$ cc., often even considerably higher than $10^{19}$ cc., and this concentration of the active impurities in the recrystallized layer is difficult to influence, this means in practice that the concentration of the active impurities in the surface of the diffused surface layer cannot be higher than the aforementioned value and is in practice considerably lower. If the said diffused surface layer serves as a base zone, as is the case in a p-n-p type transistor, this gives rise to a comparatively high resistance of the base of the transistor, which is undesirable especially for a large frequency range and for high powers. A similar disadvantage occurs if the diffused surface layer is active as an emitter zone, as is the case in an n-p-n-type transistor, because the specific resistance in the base zone must then be higher in view of the emitter efficiency and the emitter resistance is also increased. Higher concentrations would be permissible, if desired, but in this case deep etching is necessary afterwards near the junction in order to prevent the two layers from adjoining at least at the highly conductive surface. This in turn involves further complications because the properties of the pn-junction become greatly dependent upon the depth of penetration of the etchant, which is difficult to reproduce, and this deep etching in turn gives rise to an increased resistance of the base. It has previously been suggested to decrease the base resistance by increasing the thickness of the portion of the diffused surface layer located next to the recrystallized emitter zone by means of a separate prediffusion treatment, whereafter the resulting thick diffusion layer is locally removed and the thin base zone and the emitter zone are diffused and alloyed, respectively, in the cavity thus obtained. However, these additional operations give rise to a further complication of the manufacturing technique. Besides, it has previously been suggested, before applying the alloy electrode to the diffused surface layer, to decrease the high concentration of impurities in the surface by partial outdiffusion in vacuo. This method has the disadvantage inter alia that precisely that portion of the surface layer is thus removed which most adds to a decrease in the series resistance.

The present invention is based inter alia on recognition of the fact that this problem of providing a surface layer having a very high surface concentration in close proximity to an alloy electrode without impermissibly interfering with the electrical properties of the junction between the alloy electrode with its associated recrystallization layer and the semiconductor body, which problem exists not only in transistors but also in a more general sense, can be solved in simple manner by using an alloy electrode material having a gettering capacity for the active impurities of the surface layer and heating it to a sufficiently high temperature for a period long enough to enable a substantial proportion of the active impurities in direct vicinity of the alloy electrode material to reach the gettering alloy electrode. A considerable decrease in concentration, especially also in the surface of the semiconductor, may thus selectively be obtained in a simple manner in direct proximity of the alloy electrode over a very short distance, for example from 0.1 micron to 1 micron, which is determined by temperature and duration, it also being possible under certain conditions to make use of the high rate of surface diffusion.

According to the invention, when using a method of the kind mentioned in the preamble, an electrode material having a gettering power for the active impurities of the said second surface layer and intended for the formation of the said recrystallization layer is alloyed on the semiconductor body and heated further in contact with a surface concentration, applied to the continuous surface, of at least $3\times10^{18}$/cc. and preferably at least $10^{19}$/cc. of active impurities determining the conductivity type and intended for the formation of the said surface layer, the temperature and duration of the alloying and further heating being such that, due to the gettering action of the electrode material during alloying and further heating, a decrease in surface concentration of the said active impurities is selectively obtained in direct proximity of the alloy electrode material, resulting in an effective decrease of the local conductivity.

The gettering power of the electrode material is to be understood herein in a wide sense to mean that the electrode material, if desired after absorption of semiconductor material by alloying, has the capacity at least at the said higher temperature, to absorb and retain the active impurities from the adjacent surface layer which reach the electrode material by diffusion into the semiconductor body or by partial diffusion along the semiconductor surface. The gettering action may be based inter alia on physico chemical or chemical interactions, for example on a greater solubility of the active impurities in the electrode material, or on the formation of the alloys or chemical compounds as may be the case, for example, with the donor materials from the Vth column of the periodic table usually employed for germanium and silicon and the acceptor materials from the IIIrd column of the periodic table, which materials may form together $A_{III}B_V$ compounds such as, for example, aluminum arsenide.

If the gettering action is already sufficient at a temperature lower than the alloying temperature the further heating may be carried out wholly or in part at a temperature lower than the melting temperaure of the alloy electrode. The period of time necessary for obtaining the envisaged decrease will then usually be considerably longer since the active impurities have a considerably lower rate of diffusion at the lower temperature and thus need a longer time to reach the electrode material. The formation of the recrystallization layer is substantially no longer influenced by this further heating at lower temperature which may be advantageous under certain conditions.

It is also possible to use with advantage a further heating during which the electrode material is in the molten state, in which event the further heating may consist in a melting treatment for a longer time and/or at a higher temperature than is usually the case for melting and alloying under the prevailing conditions. A further heating at a higher temperature in which the electrode material is in the molten state affords the advantage that the gettering power of the electrode material and the rate of diffusion of the active impurities may be considerably higher at the higher temperature, while the discharge from the edge into the remaining portion of the electrode material through the melt may take place much more rapidly.

During further heating the body as a whole may be heated to the desired temperature, for example, in an oven in which the alloying process also takes place. During the further heating an electric current, for example in the form of current pulses, may also be passed through the junction between the recrystallization layer and the surface layer through the supply electrode present on the layers. This passage of current, which must naturally not be so intense as to involve undesirable variations in the structure of the body and of the electrodes, may add at least in part to the further heating process since it also causes dissipation of heat at the junction especially also if a pn-junction is concerned and may thus also add to an increase in the rate of diffusion. According as the decrease in concentration near the junction continues, the resulting increase in resistance will concentrate the dissipation of heat especially in the vicinity of the junction and can thus enhance a selective decrease in concentration near the junction in coaction with the gettering action of the electrode material.

The invention may be advantageous for the manufacture of semiconductor devices in which the recrystallization layer and the electrode material have the same conductivity type as that of the adjacent surface layer, for example in order to bring about a semiconductor region with effective decrease in conductivity between the recrystallization layer and the adjacent surface layer over a very short distance. The said region may be used, for example, as the photosensitive portion of a photoelectric cell having a very small distance between the electrodes and in which the recrystallization layer and the alloy electrode, on the one hand, and the surface layer with its supply electrode on the other hand, constitute the electrodes. The said region may also constitute, for example, the interelectrode space between a source electrode and a drain electrode of a field effect transistor, in which event a gate electrode has still to be connected to the said region.

The invention is also very advantageous, however, for the manufacture of semiconductor devices having a pn-junction in which event the electrode material consists, at least in part, of active impurities of a type opposite to that of the second surface layer located next to it, so that after alloying a pn-junction is formed between the recrystallization layer of the alloy electrode and the said surface layer. The invention is especially important for the manufacture of such a semiconductor device with pn-junction in which the pn-junction between the recrystallization layer and the second surface layer is intended to be operated at least substantially in the forward direction. The decrease in the concentration of impurities effective for the conductivity, which can be brought about selectively over a very short distance from the alloy electrode by using the invention, is favourable to avoid the short circuit and negative resistance effects by tunneling in the forward direction which are undesirable for many semi-conductor devices such as transistors and pn-type structures, while the advantage of a very high surface concentration may be retained over the rest of the surface layer.

As a matter of fact, the electrode material may contain active impurities, provided they do not completely neutralise by simultaneous outdiffusion, the effect of the decrease in concentration of the active impurities of the surface layer and of the local effective decrease in conductivity as envisaged by the gettering action. Consequently active impurities are preferably added to the electrode material which have a rate of diffusion considerably lower than that of the active impurities of the second surface layer so that the effect of the gettering action is substantially not disturbed or at least little disturbed by outdiffusion. A certain extent of outdiffusion is difficult to avoid in practice and is otherwise not objectionable as long as the decrease in conductivity resulting from the gettering action is retained at least in part. However, in certain cases, it is also possible to use active impurities in the electrode material which have a higher rate of diffusion if they are added, for example, only at the end of the gettering treatment, or if an electrode material is used which binds the active impurities to it so much that outdiffusion is avoided at least to an extent such that the effective decrease in conductivity is not neutralised completely. If the impurity in the electrode material is of the opposite type it may, under certain conditions, add to a further decrease in effective conductivity by compensation if the outdiffusion is small. When taking the foregoing into account, for the formation of a pn-junction the electrode material may contain donor impurities for the formation of an n-type conductive recrystallization layer, while acceptor impurities are used in the adjacent surface layer for the formation of a p-type conductive surface layer. On the other hand, for the formation of a pn-junction use may be made with special advantage of an electrode material consisting, at least in part, of acceptor impurities for the formation of a p-type conductive recrystallization layer, while donor impurities are used in the adjacent surface layer for the formation of an n-type conductive surface layer. The latter method affords the advantage, at least for the semiconductor germanium which is most commonly employed, that the acceptor materials themselves, more particularly aluminum and also indium, have a gettering action for the donor impurities and may be efficaceously alloyed with a semiconductor, while the rate of diffusion of the said acceptor materials is negligible, at least in germanium, with respect to that of the donor impurities.

The surface layer having the high surface concentration may be previously provided in the body and may be, for example, a semiconductor layer grown on the semiconductor surface epitaxially from the vapour or liquid phase in a manner known per se from the epitaxial technique, the active impurities being incorporated in the said layer during the growth. The surface layer may alternatively be provided in the body in a simple manner by diffusion of active impurities. If the electrode material has so strong a gettering action as to constitute at the same time a local masking layer which checks the diffusion of the active impurities through the electrode material itself into the underlying semiconductor for a sufficiently long time, the whole surface layer may be provided in the body only during the alloying of the electrode material by diffusion of active impurities from the ambience, which is possible, for example, with an electrode material having a sufficient concentration of aluminum which may be used in germanium for the formation of a p-type conductive recrystallization layer and which also has a masking and gettering action for the donors antimony and arsenic. The diffusion of the surface layer during the alloying of the electrode material affords the advantage that the alloying treatment, the further heating for gettering, and the provision of the surface layer are combined in one treatment because the electrode material naturally has also time enough to exert its gettering action during the diffusion of the surface layer. The diffusion of the surface layer may be effected, at least in part, preferably at least substantially, prior to the alloying of the electrode material. In this case the electrode material need not be exposed so long as so intensely to the action of the diffusing impurity. Thus it is also possible to use electrode materials having a less high gettering power and which would be unsuitable for masking. Besides, the electrode material needs to absorb a lower content of the active impurities of the surface layer and the period of interaction between the electrode material and the active impurities is shorter so that fewer or substantially no chemical conversions in the electrode material take place which may impede the attachment of supply conductors to the alloy electrode material, for example, by pressure bonding. In order to inhibit a decrease of the surface concentration or further to increase the surface concentration, in the case of a surface layer previously provided at least in part it may still be desirable during alloying and/or further heating to supply to the semiconductor surface an active impurity of the same type as that of the surface layer, more particularly the active impurity of the surface layer itself, from the ambience in the form of vapour originating, for example, from a source separately placed in the ambience. This additional supply may be omitted if substantially no decrease or at least no interfering decrease occurs under the prevailing conditions of alloying and further heating.

The recrystallization layer is deposited from the electrode material melt after alloying, the remainder of the electrode material solidifying as a metallically-conductive electrode layer on the recrystallization layer. The supply electrode for the recrystallization layer may in many cases advantageously be secured to the metallically-conductive electrode layer. However, within the scope of the invention, it is also possible to remove the said electrode layer from the recrystallization layer and to provide the supply electrode directly on the recrystallization layer, which may be advantageous in those cases where it is more difficult to attach a supply conductor to the elecrode layer than to the recrystallization layer.

The temperature and the duration of the alloying and further heating must be high enough and long enough for an effective gettering action to make the active impurities diffuse to the gettering electrode material so as to obtain the effective decrease in conductivity near the junction of the recrystallized layer, but not so high and so long that other parameters of the structure of the semiconductor body such as, for example, the thickness of the base layer of a transistor would be detrimentally affected thereby in an impermissible way. This has been found to be very well realisable in practice, for example in the manufacture of a diffusion transistor, by carrying out the diffusion of the emitter zone or the base zone in part during the alloying and further heating. Besides, under certain conditions, the active impurities of the surface layer may travel on their way to the gettering electrode material, at least in part, along the semiconductor surface where the rate of diffusion is usually considerably higher than inside the body. The temperature and the duration thus depend inter alia on the rate of diffusion, on the original surface concentration and the desired decrease, on the distance over which the decrease has to take place, and on the gettering capacity of the electrode material. The term "effective decrease in conductivity" is to be understood to mean a decrease in concentration such that it yields an effect which is useful in practice for the semiconductor device concerned, such as an increase in resistance between the electrodes which is useful in practice, for example, in the case of the photo-electric cell and the field-effect transistor already referred to hereinbefore. In case of a pn-junction between the recrystallization layer and the surface layer, the temperature and the duration of the alloying and further heating are preferable at least such that shortcircuit or the occurrence of negative resistance effects by tunneling in the forward characteristic are avoided without an after-etching treatment or after the use of at most a light-etching treatment, and that preferably a breakdown voltage in the cut-off direction of at least 0.1 volt or even 0.2 volt is obtained. By the use of the invention such values or even considerably higher values may already be obtained in many cases without an after-etching treatment even at high surface concentrations of, for example, $7\times10^{19}$/cc. In certain cases, however, a light after-etching treatment may be useful in which substantially only residues of material, if any, are removed from the surface. Also in the case of a light after-etching treatment, and this applies the more so if such a treatment is superfluous by the use of the invention, a considerable improvement is already obtained with respect to known methods in which etching away of a considerable portion of the surface near the junction was necessary and meant a very critical operation even at surface concentrations which are considerably lower. Consequently, although the after-etching treatment is preferably omitted in many cases by the use of the invention or at most a light after-etching treatment is sufficient, it is within the scope of the invention also possible, by means of an after-etching treatment, to increase further the value for the breakdown voltage which is already favourable per se by the use of the invention.

If a considerable portion of the surface layer is still diffused further into the body during the alloying and further heating, the temperature and the duration will naturally also be sufficient for an effective gettering action. To obtain a favourable gettering action, a temperature and a duration of the alloying and further heating are preferably used the diffusion product $D\times t$ of which is at least equal to $10^{-11}$ cm.$^2$ wherein D is the diffusion constant in cm.$^2$/sec. of the active impurity of the surface layer in the semiconductor body with the temperature treatment employed and $t$ is the duration in seconds. If the temperature varies, the value of said product is to be understood to mean the value integrated over the duration. The method according to the invention is clearly distinguished in this respect, and inter alia also by the use of a higher surface concentration, from known methods in which after-alloying takes place only at a low temperature and/or for so short a period that substantially no diffusion can occur or is envisaged.

When using the method according to the invention it is also possible, if desired, to use concentrations even higher than $10^{19}$/cc. and more particularly of at least $2\times10^{19}$/cc. The surface concentration may even be higher than $5\times10^{19}$/cc. Thus, for example, favourable results have already been obtained in practice with $7\times10^{19}$/cc. of arsenic in germanium with an aluminum containing electrode material and the invention may also be used with advantage at concentrations which are still higher.

The present invention and its embodiments described hereinbefore are especially important for the manufacture of transistors for ultra-high frequencies, for example having a cut-off frequency above 500 mc./s., and for the manufacture of power transistors having a large range of frequencies. In such transistors, which are designed as diffusion transistors in the form most commonly employed and in which an emitter layer and a surface layer of the base zone are located side by side on one side of the semiconductor body, one of the said two layers may be formed with special advantage by the use of the invention by the alloying of, and recrystallization from, the said electrode material having gettering power, while the said high surface concentration is incorporated in the other layer, which layer may be provided by epitaxial growth or by diffusion. Extremely small thicknesses of the layer, for example, of only a few microns or even less, as are required for very high frequencies for the base zone of a transistor, may be obtained with high accuracy by means of epitaxial growth and more particularly also by means of solid-state diffusion. However, the series-resistances in these layers, for example the base resistance, will form a severe limitation for an extension of the frequency range, especially at the said small thicknesses of the layer and also for higher powers, since such series-resistances cause a material loss of amplification and an increase in noise level. In this respect the invention provides a very valuable supplement to the known techniques since it allows in a simpler manner to provide layers with very high surface concentrations side by side in a semiconductor surface at a very short mutual distance which is adjustable in a simple manner by time and temperature, so that the serious-resistances and their detrimental effects may be considerably decreased. The invention and the embodiments above described, in so far as they may relate to diffusion, are thus advantageously applicable to the manufacture of the pnp-type diffusion transistor known per se in which an n-type conductive base layer is provided in the surface of a p-type conductive body by diffusion of donors and a p-type conductive recrystallized emitter layer is locally alloyed in the base layer. By the use of a method according to the invention the p-type conductive emitter layer is formed by alloying of, and recrystallization from, the said electrode material, the said second layer with high surface concentration being provided by diffusion of donor impurities at least in a surface part of the base layer located next to the emitter layer. The high surface concentration may be provided during the diffusion of the base zone, which diffusion is preferably carried out prior to the alloying of the electrode material for the formation of the emitter layer. It is alternatively possible to carry out the diffusion of the base zone in two steps, at least part of the base zone first being diffused, prior to the provision and the alloying of said electrode material, at a lower surface concentration, while the said high concentration is diffused into the surface during the alloying and further heating. Due to the alloying and further heating, the desired decrease in donor concentration may be obtained at the junction between the electrode material and the surface layer by the gettering action.

The present invention and its embodiments above described, at least in so far as they may relate to the diffusion of the second surface layer, have been found to be especially useful for the manufacture of an npn-type diffusion transistor in which in a semiconductor body having a p-type conductive layer intended as a base zone and which may be provided, for example, by diffusion of acceptor impurities such as, for example, indium or by epitaxial growth, there is locally provided in the layer intended as a base zone, a p-type conductive recrystallization layer for through-connection to the supply electrode of the base, while an n-type conductive emitter layer is provided by diffusion of a donor in an adjacent portion of the base zone. When using a method according to the invention the p-type conductive recrystallization layer is obtained by the alloying of, and recrystallization from, the said electrode material and the n-type conductive emitter layer is formed by diffusion of the donor while using the said high surface concentration.

The diffusing n-type conductive layer may be limited afterwards to the desired surface area, for example, by means of an etching treatment known per se during which the semiconductor body, except the parts to be removed, are covered with an etch-resistant masking layer. To this end, the electrode material intended for the formation of the recrystallization layer is preferably provided so as to surround a freely-located portion of the semiconductor surface, for example in the form of an annular or elliptic layer, the emitter layer being provided by diffusion at least in the surrounded freely-located surface part of the body.

Portions of the n-type conductive diffusion layer located outside the recrystallization layer may be removed afterwards by etching so that the surface of the emitter zone is limited to the surface area enclosed by the recrystallization layer. This method affords the advantage that a very low resistance of the base is obtained, while the shape of the emitter layer is also determined by the shape of the electrode layer applied. If the electrode material has a gettering action so strong as to involve also a sufficient masking action against diffusion of donor through the electrode material, the diffusion of the emitter layer may be completely carried out during the alloying and further heating of the electrode material by the supply of a donor from the ambience, during which process sufficient time is naturally available to allow the electrode material to exert its gettering action. However, the n-type conductive layer, intended as the emitter layer, is advantageously provided by diffusion in the p-type conductive base zone at least in part, preferably substantially, prior to applying and alloying the electrode material, for example at the same time as the diffusion of the base zone or in a separate treatment after the diffusion of the base zone, whereafter the electrode material is provided on the n-type conductive layer and into the p-type conductive base zone by alloying through the n-type conductive layer. During the alloying and further heating it is also possible, if necessary, to supply the donor to the semiconductor surface from the ambience in order to increase the high surface concentration in the n-type conductive layer, intended as the emitter layer, or to inhibit a considerable decrease thereof. By the use of the invention it is possible to use a very high conductivity in both the recrystallization layer and the directly adjacent diffusion layer, while a considerable decrease in concentration over a very short distance may be selectively obtained near the junction due to the gettering action during the alloying and further heating which is favourable for a high resistance of the base.

More particularly an electrode material containing a sufficient concentration of aluminum, preferably at least 30 at. percent, has been found suitable as the acceptor-containing electrode material with gettering power and it is often very efficacious to use an electrode material consisting substantially of aluminum, in which event a small amount of indium may also advantageously be added to enhance uniform alloying. Indium and indium-gallium alloys have also been found suitable, although aluminum is preferable in many cases because of its lower rate of surface diffusion, especially in germanium when alloyed with it. Besides, aluminum has the property that it can mask against the diffusion of donor for a sufficiently long time. Although the invention is also applicable to other semiconductors and inter alia analogous favourable effects may occur with silicon and, for example, aluminum as the electrode material, the invention has yet been found especially useful in the manufacture of semiconductor devices having a semiconductor body of germanium. Active impurities for the surface layer which can be used with a very favourable effect, especially in germanium and in combination with aluminum or indium as the electrode material, are the donors antimony and arsenic, especially arsenic because of the higher solubility of arsenic in germanium.

Lastly, the invention also relates to the semiconductor device, more particularly the transistor as may be manufactured with special advantages by the use of a method according to the invention.

The invention and several special embodiments thereof will now be described in detail, by way of example, with reference to a few more detailed embodiments and diagrammatic figures.

In the manufacture according to the invention of npn-type germanium transistors for high frequencies start is made, for example, from an n-type conductive germanium plate 1 having a specific resistance of about 0.5 ohm-cm. and dimensions of, for example, 10 mm. x 10 mm. x 100$\mu$ so that 100 such transistors can be manufactured on it at the same time. The impurity determining the conductivity type which is contained in the plate is antimony in a concentration of about $3\times10^{15}$/cc. which rapidly diffuses into germanium (see FIGURE 1).

A p-type conductive layer 2 about 1.6 microns thick is diffused into an n-type conductive plate 1 by heating the plate covered with powdered germanium containing $4\times10^{18}$ indium atoms per cc., at about 800° C. in an atmosphere of hydrogen for about 2 hours. Since indium is a slowly-diffusing impurity the time available for the rapidly-diffusing antimony is sufficient for it also to diffuse out so that the p-type conductive layer 2, intended as the base zone, ultimately passes through a pn-junction 3 into an n-type conductive transition layer having a decreased effective concentration of donors also due to compensation in the initially n-type conductive interior of the body which is intended as the collector zone. A p-$n^-$—$n^+$ junction from the base zone to the collector zone is even more favourable and is aimed at for obtaining a low capacity and a low resistance of the collector if the said junction is obtained on an n-type conductive substrate by epitaxial growth from the vapour phase or by a combination of growth and diffusion, as previously stated in the preamble.

Figure 2:
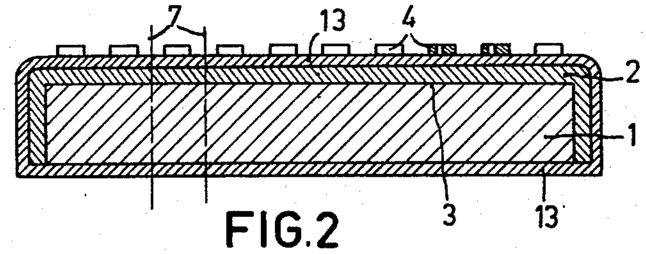

The upper side of the plate 1 is now covered with an etch-resistant layer of wax and an about 5$\mu$ thick layer (including the layer 2 on the lower side) is etched away along the broken line 6 in an etching bath consisting of 10 parts by volume of HF (50%), 14 parts by volume of $HNO_3$ (65%), 1 part by volume of $H_2O$ and 0.5 part by volume of alcohol. Next the plate is heated at 650° in an atmosphere of arsenic for 5 minutes, the diffusion source used being pure arsenic heated at 440° C. The whole takes place in an atmosphere of pure $H_2$. During this heating process an n-type conductive layer 13 about 0.4 micron thick is formed on all sides in the body (see FIGURE 2), said layer having a concentration at the surface of about $7\times10^{19}$/cc. and being intended as the emitter zone. Now 100 rings 4 in 10 rows of 10 consisting substantially only of aluminum are evaporation-deposited through a mask in the usual manner on the n-type conductive layer 13, the rings being evenly distributed with a spacing between them of about 0.9 mm. FIGURE 2 is a cross-sectional view of the plate at a row of 10 rings. Next alloying of the aluminum 4 and the further heating take place.

Figure 1:
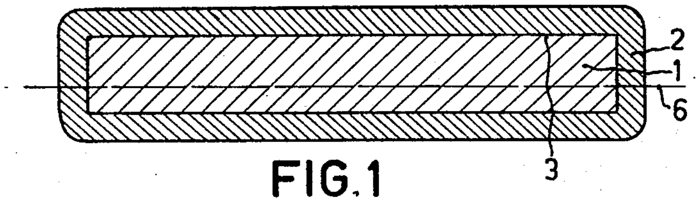
FIGURES 1, 2, 4, 5 and 6 show in cross-section successive stages of a semiconductor body in the manufacture of an npn-type transistor according to the invention.
Figure 3:
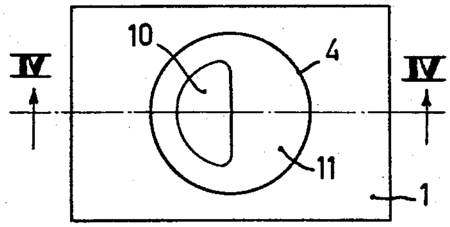
FIGURE 3 is a plan view of the seimconductor body of FIGURE 4.
Figure 4:
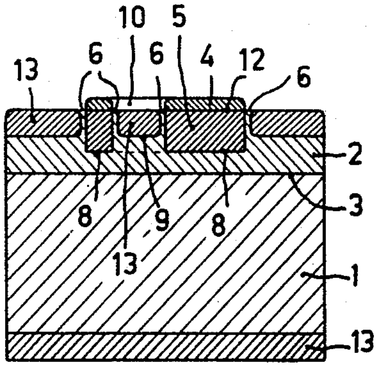

The foregoing may be explained more fully with reference to FIGURES 3 and 4 which show in plan view and in cross-section, respectively, a portion of the plate of FIGURE 1, namely that situated between the broken lines 7 and corresponding to one ultimate transistor, in greater detail and in enlarged size. For the sake of simplicity and clarity of the drawing, only the treatment of this portion of the plate 1 will be shown also in the further FIGURES 4 to 6 since the treatment of the other 99 portions takes place simultaneously (at least up to FIGURE 5) and in the same manner.

FIGURE 3 shows more clearly in plan view the shape of the ring 4 which possesses and surrounds a cavity 10 which is located asymmetrically with respect to the ring and leaves free a surface of the n-type conductive layer 13. The ring has an external diameter of about 60$\mu$ and the shape of the cavity 10 approximately corresponds to that of a hemicircle having the same centre as the circumference of the ring and a radius of about 20 to 25 microns. This elongated shape of the cavity has the additional advantage of a favourable combination of a low resistance of the base and a low capacity of the collector and still allows of simple contacting. The thickness of the evaporation-deposited ring, prior to alloying, is about 0.4 micron. Due to alloying, a recrystallization layer 5 having a shape substantially identical with that of the ring 4 is obtained. The recrystallization layer 5, which has a high p-type conductivity of $10^{19}$ to $10^{20}$ atom/cc. because of its aluminum content, penetrates into the plate up to a short distance from the pn-junction 3. When the specific resistance of the n-type conductive layer 1 is not unduly low or when no high requirements are imposed on the capacity of the collector, the recrystallization layer 5 may also penetrate, if desired, into the n-type conductive body 1.

During the evaporation-deposition, the ring 4 consists, preferably substantially, of aluminum and a content of say, 6% by volume of indium. The indium is preferably first evaporation-deposited and then the aluminum. The addition of indium enhances uniform alloying of the germanium.

The aluminum 4 has a gettering power for the donor arsenic. The alloying of the aluminum 4 and the further heating are combined into one temperature treatment and for this purpose the assembly is heated in an oven to 700° C. so that the temperature is raised from 500° C. to 700° C. within 50 seconds, then maintained at 700° C. for a few seconds, for example 2 seconds, and lastly decreased by cooling from 700° C. to 500° C. within 90 seconds. At 500° C., 600° C. and 700° C. the diffusion constant of arsenic is $2\times10^{-15}$ sq. cm./sec., $1.1\times10^{-13}$ sq. cm./sec., and $2.6\times10^{-12}$ sq. cm./sec., respectively, at a surface concentration of $7\times10^{19}$ As/cc. The integrated $D\times t$ product of this temperature treatment is at least $3\times10^{-11}$ sq. cm. The diffusion constant is negligible below 500° C. During the said temperature treatment the arsenic can diffuse from the surface layer 13 into the adjacent aluminum 3 and the resulting melt so that the aluminum is active as a getter. Thus a decreased concentration of arsenic in a region 6 is formed at the edge of the aluminum ring 4 and the p-type conductive recrystallization layer 5 over a very short distance which is from 0.1 micron to 1 micron. After cooling, the p-type conductive recrystallization layer 5 and the contact 4 are deposited from the melt of the aluminum 4 which has penetrated through the n-type conductive layer 13 in the layer 2 up to line 8 by dissolution of germanium (see FIGURE 4) so that a highly doped p-type conductive recrystallization layer 5 with its contact 4 is located next to a highly doped part of the surface of the n-type conductive diffusion layer 13. Nevertheless short-circuit and interfering tunnel effects are bound to be avoided and the breakdown voltage of 0.2 volt to 0.4 volt, which is favourable for an emitter junction, is usually already obtained without a light after-etching treatment, which is to be regarded as surprising.

Figure 5:
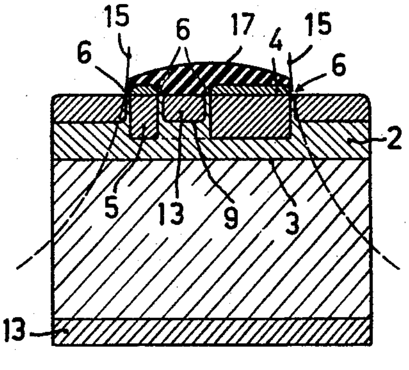
Figure 6:
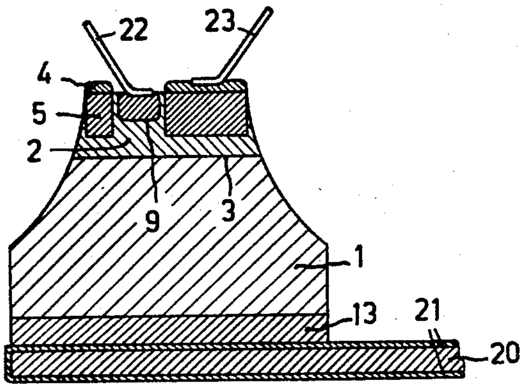

FIGURES 4 to 6 consequently show that the emitter junction 9 intersects the surface of the semiconductor at a short distance from the melt 12 and the base-contact ring 4, for which indications have also been found on a cross-section of larger design of such a configuration. The sucking action of the electrode material melt may even be so intense that the concentration of donor is decreased over this distance so that a thin p-type conductive layer 6 of the initial layer 2 remains between the melt and the n-type conductive diffusion layer. So great a decrease in the concentration of donor, although preferably aimed at, is not necessary, however, since an improvement in breakdown voltage is naturally also obtained if the n-type conductive diffusion layer 13 is adjacent the recrystallization layer 5 and the base contact 4 with a decreased concentration of donor.

The portions of the n-type conductive layer 13 and of the p-type conductive layer 14 located outside the ring 4 are subsequently etched away along the broken lines 15 (see FIGURE 5). To this end, the lower side of the plate is masked by an etch-resistant wax or masking layer 17, which is provided on the upper side of the plate on the rings 4 and the cavity 10, which may be effected, for example, by a photographic means or by evaporation-deposition through a mask in a manner known per se. The assembly is then immersed in an etching bath composed of 10 parts by volume of HF (50%), 14 parts by volume of $HNO_3$ (65%), 1 part by volume of $H_2O$ and 0.5 part by volume of alcohol until about 5 microns of the upper side are etched away along the broken line 15, whereafter the masking layer 17 is dissolved and removed.

So far the whole of the plate of FIGURE 1 has undergone the same treatment. Now the plate 1 is divided into the individual 100 transistors by scratching and breaking. The lower side of each transistor is soldered (see FIGURE 6) on a Fernico-carrier 20, covered with a gold layer 21, at about 500° C.

The ring 4 and the recrystallized layer 5, which serves as an ohmic connection to the base, surround the emitter zone 13 at a distance which is very short and automatically reproducible so that difficulties in providing a base contact at a short distance from the emitter zone are already avoided. About 7μ thick Au-wires 22 and 23 are now provided on the emitter zone 13 and on the broad side of ring 14 in known manner by pressure bonding with the aid of sapphire chisel. Next the assembly is lightly etched at room temperature, if this should be necessary, in a light etchant consisting of 10% $H_2O_2$ in order to remove any residues of metal from the surface.

The transistor is now ready to be mounted in an envelope in the usual manner. Such an npn-type transistor has been found to have exceptionally good properties inter alia due to the use of the invention, while the manufacture is still simple and reproducible by the use of the invention. Thus, the amplification factor of such a transistor is still from 13 db to 16 db at 800 mc./s. and the breakdown voltage of the emitter is from 0.2 volt to 0.4 volt. The cut-off frequency is, for example, 2000 mc./s. or even higher. Besides, the noise factor may be exceptionally low, namely from 5 db to 6 db, hinting at the occurrence of a very low resistance of the base which is about 25 ohm to 50 ohm at a given small thickness of about 1 micron for the base zone.

It has also been found possible to carry out the diffusion of the layer 13, after the provision of the aluminum rings 4, partly or completely, during the alloying process in which the aluminum-germanium melt was found to have, in addition to the gettering action, a sufficient masking action. The duration of the alloying process is in this case correspondingly longer in order to obtain the desired depth of penetration of the layer 13. However, the example given hereinbefore, in which the diffusion of the layer 13 was effected substantially prior to the provision of the aluminum rings 4, affords the advantage that the supply wire 23 can be attached afterwards to the aluminum ring more rigidly and in a simpler manner, probably because of the fact that the aluminum-germanium melt has been exposed to the action of arsenic for a short time.

From the following experiments it may appear that not only those contact materials are suitable which consist of aluminum at least substantially.

For example, it has been found that contact material layers of aluminum-gold-nickel (0.1μ of Al, 0.1μ of Au, 0.1μ of Ni) and of aluminum-lead (0.1μ of Al, 0.1μ of Pb, 0.1μ of Al) likewise have a gettering action for arsenic. The breakdown voltage after light etching is in each case about 0.3 volt. Analogous favorable results were also obtained with indium and alloys of indium and gallium, for example 0.5% of Ga.

From the example following hereinafter it may appear that the gettering action and partly masking action may also be utilized in the case of a pre-diffused layer.

Arsenic is diffused at 650° C. for 4 minutes at a surface concentration of $7\times10^{19}$/cc. (As-source at 440° C.) into a p-type conductive germanium plate having a specific resistance of about 0.5 ohm-cm., resulting in a 0.6μ thick n-type layer being formed. An aluminum-indium ring of the same size and composition as previously described with reference to FIGURES 3 to 6 is evaporation-deposited on the said layer and pre-alloyed at 700° C. up to a depth of about 1 micron. Next a considerable further diffusion of arsenic is used, namely at 650° C. for 4 minutes, while the ring is again substantially in the molten state and arsenic is supplied with a surface concentration of $7\times10^{19}$/cc. The ultimate thickness of the diffusion layer is 0.9$\mu$ and no diffusion of donor or at least no n-type conductive layer can be found under the melt or under the p-type conductive recrystallization layer resulting therefrom. The breakdown voltage is, usually without after-etching, if desired after light after-etching, still about 0.3 volt due to the sucking action of the melt.

Figure 7:
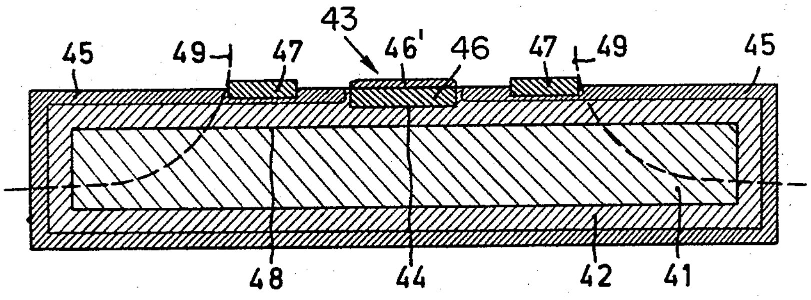
FIGURE 7 shows a cross-section of a manufacturing stage according to the invention of a semiconductor body of a pnp-type transistor.

One embodiment of the method according to the invention will now be briefly described for the manufacture of a pnp-type transistor on germanium with reference to FIGURE 7.

Start is made from an n-type conductive germanium plate 41 having a specific resistance of, say, 1 ohm-cm. Arsenic is first diffused into the said plate at a high surface concentration, for example $2\times10^{19}$/cc. During diffusion, the plate 41 is heated to about 750° C. whereby an n-type conductive diffusion layer 42 of about 2$\mu$ thick is formed. The concentration at the surface of the diffusion layer 42 has the aforementioned high value in the manner usual for diffusion, whereas it greatly decreases at a greater depth. The layer of high surface concentration is shown diagrammatically by 45. Now a strip of an Al-In alloy 43 (7% by volume of In), which is 0.3$\mu$ thick and 100$\mu$ long and 25$\mu$ wide, is evaporation-deposited on the layer 45 and then alloyed at 650° C., the depth of penetration of the front 44 of the melt being about 0.7$\mu$. The alloying treatment is carried out until a considerable gettering action can occur. Upon cooling, a p-type conductive recrystallization layer 46 is deposited from the melt due to the high segregation constant of aluminum and, lastly, a metallic contact 46'. During alloying, substantially no diffusion of donor takes place from the ambience through the front 44 of the melt and a favorable breakdown voltage between the emitter layer 43 and the base layer (42, 45) can still be obtained by the gettering action despite the high surface concentration. The layers 42 and 45 may be provided in the usual manner, either at the same time or afterwards, with base contacts, for example in the form of two equally large strips 47, consisting of Au-Sb alloy (2% of Sb) which establish a low-resistance connection of the base through the highly doped surface of the base layer 42.

The body thus treated as shown in FIGURE 7, may be treated further in the usual manner to obtain a pnp-type transistor. To this end, the collector junction 48 is limited by an etching treatment along the broken lines 49 while simultaneously masking the body at the strips 47 and 43 and between them, the layers 42 and 45 being etched away from the lower side to establish an ohmic connection to the collector zone 41. It is possible to carry out the diffusion of the base layer 42 in two steps due to the masking action of the aluminum 46. During the first phase, prior to the provision and alloying of the aluminum 46, an n-type conductive layer 42 of, for example 1.5$\mu$ thick is then formed at a lower surface concentration, for example $10^{16}$ cc. of As. During the alloying and further heating of the aluminum 46, a high surface concentration of, say $7\times10^{19}$/cc. is applied for a short time so that a surface layer of high conductivity, which is, for example, a few tenths of a micron thick, is formed in the surface of the n-type conductive layer 42. However, a lower surface concentration may be retained, due to the gettering action, in direct proximity of the edge of the aluminum layer 46. The diffusion in two steps, in which the final diffusion step is carried out during the alloying of the aluminum, has the further advantage that the concentration gradient of the donor in the portion of the base zone located under the recrystallization layer 46 may be determined or chosen independently of the high surface concentration in the surface layer.

In the foregoing examples arsenic has always been used as the impurity. Analogous results may also be obtained, however, with other donors such as antimony, although arsenic is to be preferred especially at high surface concentrations above $10^{19}$/cc.

In conclusion, it is to be noted that many variations are possible for an expert without passing beyond the scope of the invention. Thus, for example, the transistor types shown in FIGURE 7 may be improved further by using, instead of a homogeneous p-type conductive body, a body having a $p^{-}$—$p^{+}$ structure in which the $p^{+}$ part of high conductivity is a substrate on which the $p^{-}$ layer of low conductivity has grown epitaxially from the vapour phase. The said diffusion of donor may then be carried out into the $p^{-}$ layer. In the embodiment shown in FIGURES 1 to 6 it is possible to use cavities of other elongated shapes, or the base contact may be annular and surround a cavity which is concentric therewith. The emitter zone may also be formed as an elongated layer next to an elongated base-contact strip or between two base-contact strips. In the embodiment shown in FIGURE 7 it is also possible to use an annular emitter and to provide one or more base contacts inside or outside the said ring. The method according to the invention is also applicable to the manufacture of a circuit incorporated in a semiconductor body, which circuit includes a semiconductor device of the kind mentioned in the preamble. By suitable choice of the electrode material so that it has a sufficient gettering power, other semiconductors also enter into account for use of the method according to the invention. Thus, for example, in the $A_{III}B_{V}$ compounds, the acceptors from the IInd column of the periodic table and the donors from the VIth column may constitute compounds so that gettering action of an element from one column may occur for the element from the other column.

What is claimed is:

1. A method of making a semiconductor device comprising forming in a semiconductor body a surface layer containing acceptor or donor impurities in a surface concentration of at least about $10^{19}$/cm.$^3$, fusing and alloying at said surface layer a solvent metal containing impurities of the opposite character to that contained in the surface layer and penetrating through the surface layer so that upon subsequent cooling a highly-conductive recrystallized region doped with said opposite impurities and forming a p-n junction with said surface layer is produced, said metal also including an element which when heated is capable of combining with the impurities in the surface layer to such a high degree that the free impurity concentration adjacent the recrystallized region is significantly lower than the impurity concentration at a corresponding level elsewhere in the body, further heating said metal at a temperature and for a time sufficient to cause the said combining element to selectively absorb the layer impurities and decrease their concentration adjacent thereto, cooling the assembly to solidify the melt forming the said recrystallized region adjacent the impurity-depleted regions of the surface layer, and providing connections to the surface layer and solidified metal.

2. A method as set forth in claim 1 wherein an electric heating current is passed through the junction of the recrystallized region and the surface layer as part of the further heating step.

3. A method as set forth in claim 1 wherein the opposite impurities of the metal exhibit a higher diffusion rate than that of the impurities in the surface layer.

4. A method as set forth in claim 1 wherein the metal solvent is in the form of an annulus.

5. A method of making a double-diffused n-p-n transistor comprising forming in a germanium semiconductor body of n-type conductivity a diffused p-type base layer, forming on the p-type layer a diffused n-type emitter surface layer containing donor impurities in a surface concentration exceeding $10^{19}/cm.^3$, thereafter fusing and alloying at said n-type surface layer a solvent metal containing acceptor impurities and penetrating through the n-type surface layer so that upon subsequent cooling a recrystallized region doped with said acceptor impurities and forming a base contact to the base layer and a p-n junction with said surface layer is produced, said metal also including at least 30 atomic percent of aluminum which when heated is capable of combining with the donor impurities in the surface layer to such a high degree that the free donor impurity concentration adjacent the recrystallized region is significantly lower than the impurity concentration at a corresponding level elsewhere in the body, further heating said aluminum-containing metal melt at a temperature and for a time sufficient to cause the said aluminum to selectively absorb the donor impurities and decrease their concentration adjacent the melt, cooling the assembly to solidify the melt forming the said recrystallized region connected to the base layer and adjacent the impurity-depleted regions of the surface layer, and providing connections to the base contact and emitter layer.

6. A method as set forth in claim 5 wherein the contact metal consists substantially of aluminum, and the donor surface concentration exceeds $5\times10^{19}/cm.^3$.

7. A method as set forth in claim 5 wherein the contact metal consists essentially of aluminum and up to 10 atomic percent of indium.

8. A method as set forth in claim 5 wherein the solvent metal has an annular form, the n-type surface layer within the annulus constituting the active emitter region.

References Cited

UNITED STATES PATENTS

| | | | |
|---|---|---|---|
| 2,836,523 | 5/1958 | Fuller | 148—185 |
| 3,076,253 | 2/1963 | Cornelison et al. | 148—185 |
| 3,078,397 | 2/1963 | Tummers et al. | 148—185 |
| 3,165,429 | 1/1965 | Benjamin | 148—185 |

DAVID L. RECK, *Primary Examiner.*

HYLAND BIZOT, *Examiner.*

R. O. DEAN, *Assistant Examiner.*